United States Patent
Caplet

(10) Patent No.: US 8,557,698 B2
(45) Date of Patent: Oct. 15, 2013

(54) METHOD FOR PRODUCING A MICROMECHANICAL AND/OR NANOMECHANICAL DEVICE WITH ANTI-BONDING STOPS

(75) Inventor: Stéphane Caplet, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 140 days.

(21) Appl. No.: 12/336,317

(22) Filed: Dec. 16, 2008

(65) Prior Publication Data
US 2009/0170312 A1     Jul. 2, 2009

(30) Foreign Application Priority Data
Dec. 27, 2007   (FR) ...................................... 07 60402

(51) Int. Cl.
*H01L 21/477*    (2006.01)

(52) U.S. Cl.
USPC ................... 438/660; 257/415; 257/E29.324; 438/50; 216/2; 216/62

(58) Field of Classification Search
USPC .................. 257/415–417, E21.497, E29.324; 438/50, 52; 216/2, 62, 72
See application file for complete search history.

(56) References Cited

U.S. PATENT DOCUMENTS

| | | | |
|---|---|---|---|
| 5,750,420 A * | 5/1998 | Bono et al. ...................... | 438/52 |
| 5,847,454 A * | 12/1998 | Shaw et al. .................... | 257/734 |
| 2003/0215974 A1* | 11/2003 | Kawasaki et al. ............... | 438/50 |
| 2006/0144816 A1* | 7/2006 | Grange et al. .................. | 216/57 |

FOREIGN PATENT DOCUMENTS

| | | |
|---|---|---|
| EP | 0 754 953 A1 | 1/1997 |
| EP | 1 857 406 A2 | 11/2007 |
| JP | 60035575 A * | 2/1985 |

OTHER PUBLICATIONS

Fujitsuka et al; "A new processing technique to prevent stiction using silicon selective etching for SOI-MEMS", Sensors and Actuators A, Elsevier Sequioa SA, Lausanne, CH, vol. 97-98, Apr. 1, 2002, pp. 716-719.
French Preliminary Search Report, dated Sep. 26, 2008.

* cited by examiner

*Primary Examiner* — Ermias Woldegeorgis
(74) *Attorney, Agent, or Firm* — Pearne & Gordon LLP

(57) ABSTRACT

A method for producing a micromechanical and/or nanomechanical device includes partial etching of at least one sacrificial layer arranged between a first layer and a substrate, forming at least one cavity in which is arranged at least one portion of the sacrificial layer in contact with the first layer and/or the substrate. The method also includes chemical transformation of at least one wall of the first layer and/or the substrate in the cavity, delimiting at least one stop in the first layer and/or the substrate at the level of the portion of the sacrificial layer. The portion of the sacrificial layer and the chemically transformed wall of the first layer and/or the substrate is also eliminated.

12 Claims, 4 Drawing Sheets

METHOD FOR PRODUCING A MICROMECHANICAL AND/OR NANOMECHANICAL DEVICE WITH ANTI-BONDING STOPS

TECHNICAL FIELD

This document concerns the field of micromechanical and/or nanomechanical devices comprising mobile elements, and more particularly that of micro-electromechanical systems (MEMS) and/or nano-electromechanical systems (NEMS) comprising mobile elements capable of entering into contact with other elements of the MEMS and/or NEMS during its operation.

STATE OF THE PRIOR ART

Some micromechanical or nanomechanical devices, such as MEMS or NEMS (for example accelerometers or gyrometers), comprise mobile elements that make it possible for example to carry out physical measurements such as an acceleration undergone by such a MEMS or NEMS. These physical measurements are obtained thanks to the relative movements of these mobile elements compared to other elements of the MEMS or NEMS. It is therefore important that these mobile elements are maintained at distance from the other elements of the MEMS or NEMS to preserve their freedom of movement. Nevertheless, given this freedom of movement, the mobile elements are capable of coming into contact with the other elements, fixed or mobile, of the MEMS or NEMS, thereby being able to lead to a "bonding" of the elements to each other. In the case of bonding, the movement of the mobile elements is no longer assured during the operation of the MEMS or NEMS, making it malfunction.

Such a bonding may also occur during the formation of the device, and particularly during a step of drying solvents used for rinsing the structure after the implementation of wet etching steps.

To prevent this inopportune bonding, it is known to form anti-bonding stop pins, or stops, on the surfaces of the elements of the MEMS or NEMS that are capable of coming into contact with each other. These anti-bonding stop pins make it possible in particular to limit the contact surface in case of collision and therefore to reduce the risks of bonding of mobile elements of the MEMS.

Document EP 0 754 953 A1 describes a method for producing anti-bonding stop pins on the surface of a structure that is formed in a useful layer based on silicon arranged on a silicon oxide layer and a silicon substrate. This method comprises a first step of etching of the oxide layer with hydrofluoric acid to form silicon oxide spacers based between the substrate and the useful layer. The useful layer and the substrate are then etched by wet etching, for example with a potash solution, the spacers then forming etching masks. This second etching step forms the anti-bonding stop pins in the useful layer and in the substrate. Finally, the spacers are eliminated, thereby completely freeing the structure, formed in the useful layer, of the substrate.

This method has in particular the drawback of roughening the surfaces of the structure subjected to the etching agents, for example the front faces of the useful layer. Such roughness may pose problems, particularly for the subsequent implementation of operations on these surfaces, for example a direct sealing (or molecular sealing) of a cover covering the structure on the front face of the useful layer.

DESCRIPTION OF THE INVENTION

Thus there is a need to propose a method for producing a micromechanical and/or nanomechanical device with anti-bonding stops, or stop pins, that does not have the drawbacks of the prior art, and particularly does not deteriorate the surfaces of the device during the formation of the stops.

To achieve this aim, one embodiment proposes a method for producing a micromechanical and/or nanomechanical device comprising at least the steps of:

partial etching of at least one sacrificial layer arranged between a first layer and a substrate, forming at least one cavity in which is arranged at least one portion of the sacrificial layer in contact with the first layer and/or the substrate, chemical transformation of at least one wall of the first layer and/or the substrate in the cavity, delimiting at least one stop in the first layer and/or the substrate at the level of the portion of the sacrificial layer, elimination of said portion of the sacrificial layer and the chemically transformed wall of the first layer and/or the substrate, freeing the stop.

Thus, a micromechanical and/or nanomechanical device is formed comprising at least one anti-bonding stop without deteriorating the surfaces of the device during its method of production, and particularly without roughening these surfaces. Thus, this method of production is compatible with subsequent steps making use of in particular non rough surfaces, for example the formation of a cover by direct sealing, or molecular adhesion, on the device.

According to a particular embodiment, before the elimination step, several other steps may be implemented to form the micromechanical and/or nanomechanical device (depositions, etching, etc.). In particular, when the step of chemical transformation is carried out at high temperature, for example a step of siliconizing, it may be advantageous to implement these steps of forming the device between the chemical transformation step and the elimination step.

According to a first embodiment, the chemical transformation step may comprise at least one thermal oxidation of the wall of the first layer and/or the substrate.

According to a second embodiment, the chemical transformation step may comprise at least one deposition of a metal layer on the wall of the first layer and/or the substrate, and a siliconizing of the metal layer. In this case, the first layer and/or the substrate may be based on silicon. In addition, the metal layer may be based on titanium and/or nickel. This siliconizing may be obtained by a heat treatment at around 700° C., for example for several minutes, of a titanium layer deposited on the silicon (metal layer based on titanium and wall of the first layer and/or the substrate based on silicon).

Thus, according to one embodiment, the use of a chemical transformation to delimit the stop before eliminating the chemically transformed material enables the implementation of a selective etching of the chemically transformed material compared to the remainder of the useful layer and the substrate. Moreover, the interface between the transformed material and the remainder of the useful layer and/or the substrate may be defined by the chemical transformation, this interface does not have the roughness of etched surfaces as in the prior art described previously.

Advantageously, the sacrificial layer may be based on at least one material insensitive to the chemical transformation step, in other words a material such that the chemical transformation step does not affect this material. In the case of a thermal oxidation of silicon or a siliconizing of silicon, for example a sacrificial layer based on silicon oxide may be chosen.

The sacrificial layer may also be based on a material which, if it undergoes the chemical transformation, may be eliminated in a selective manner compared to the useful layer and/or the substrate.

Moreover, the chemical transformation step also makes it possible to clean any residues of material found on the device generated by the previous steps.

The partial etching may be carried out through at least one opening formed through the first layer.

The first layer may be based on at least one semi-conductor and/or the sacrificial layer may be based on at least one semi-conductor oxide and/or the substrate may be based on at least one semi-conductor.

The useful layer and/or the substrate are not necessarily single layer, or homogeneous. They may for example comprise elements of the device formed before the stops.

Advantageously, the oxidation step may be carried out by a heat treatment, for example by wet or dry process.

Preferably, the etching step may be obtained by the implementation of a wet or vapour phase etching.

The chemical transformation of the wall may be carried out over a thickness between around 200 Å and 2000 Å.

The height of the stop obtained may correspond to the thickness eliminated from the chemically transformed wall of the first layer and/or the substrate layer.

The method may further comprise, after the step of eliminating said portion of the sacrificial layer, a step of forming a cover on the first layer.

These embodiments particularly applies to the production of microactuators and/or nanoactuators, micropumps and/or nanopumps, micromotors and/or nanomotors, accelerometers, microsensors and/or nanosensors, or any microsystem and/or nanosystem comprising at least one mobile element.

BRIEF DESCRIPTION OF DRAWINGS

The present invention will be better understood on reading the description of embodiments given purely by way of indication and in no way limiting and by referring to the appended drawings in which.

Identical, similar or equivalent parts of the different figures described hereafter bear the same number references so as to make it easier to go from one figure to the next.

In order to make the figures easier to read, the different parts in the figures are not necessarily represented at a uniform scale.

The different possibilities (alternatives and embodiments) should be understood as not being mutually exclusive of each other and may be combined together.

DETAILED DESCRIPTION OF PARTICULAR EMBODIMENTS

Reference will be made to FIGS. 1 to 5 representing the steps of a method for producing a micromechanical and/or nanomechanical device 100 with anti-bonding stops according to a first embodiment.

Figure 1:
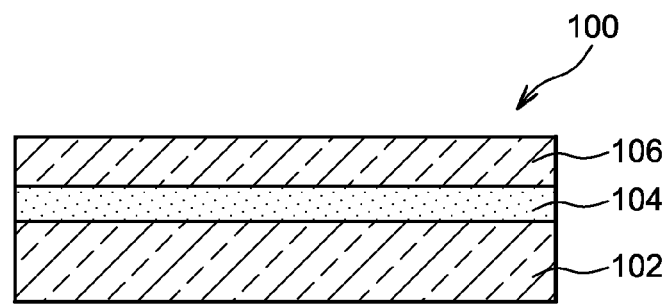
FIGS. 1 to 5 represent the steps of a method for producing a micromechanical device with anti-bonding stops according to a first embodiment.

As represented in FIG. 1, a micromechanical and/or nanomechanical device 100, for example a MEMS, is formed from a substrate 102 for example based on at least one semi-conductor, for example silicon, on which is arranged a dielectric layer 104, for example based on an oxide such a silicon oxide and used here as sacrificial layer, and a useful layer 106 for example based on at least one semi-conductor such as silicon. The layers 102, 104 and 106 here form a SOI (silicon on insulator) substrate. The sacrificial layer 104 may for example have a thickness equal to around 0.4 μm, the useful layer 106 may have a thickness between around 1 μm and 200 μm.

Useful layer is taken to mean a layer of material, or a portion of such a layer, in which is formed a micromechanical type structure.

Figure 2:
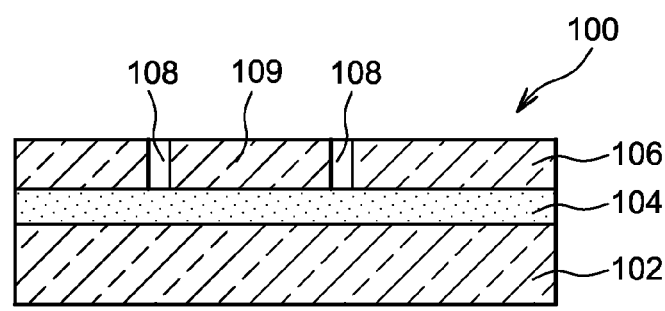

Openings 108 are then formed, for example in the useful layer 106, thereby forming accesses to the sacrificial layer 104 (see FIG. 2). In the first embodiment described here, the openings 108 are formed by profitably employing photolithography and etching steps, for example of RIE (reactive ion etching) type, implemented to form and shape the structure of the MEMS 100, in other words the different elements of the MEMS 100.

The openings 108 are for example trenches delimiting a portion 109 of the useful layer 106, forming a first element of the MEMS 100 such as a mobile element of the MEMS 100, for example a suspended membrane if the MEMS 100 is a sensor. In the embodiment example described, the portion 109 is intended to be mobile principally along the axis y represented in FIG. 3.

Figure 3:
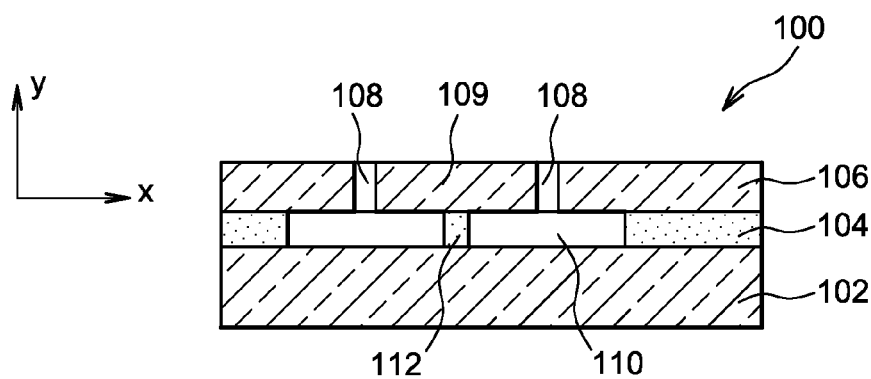

A partial etching of the sacrificial layer 104 through the intermediary of the openings 108 formed previously is then carried out. Since the sacrificial layer 104 is here silicon oxide based, this etching may for example be carried out by hydrofluoric acid. As represented in FIG. 3, not all of the sacrificial layer 104 is etched. A cavity 110, arranged between the useful layer 106 and the substrate 102 is thereby formed, in which one or several portions 112 of the sacrificial layer 104 are conserved, forming here spacers between the portion 109 of the useful layer 106 and the substrate 102. The number of these spacers and their distribution are adapted as a function of the portion 109, particularly as a function of the size and the shape of the portion 109. In the example of FIG. 3, the portion 112 of the sacrificial layer 104 extends between the portion 109 of the useful layer 106 and the substrate 102, in other words is in contact with the portion 109 of the useful layer 106 and with the substrate 102.

Figure 4:
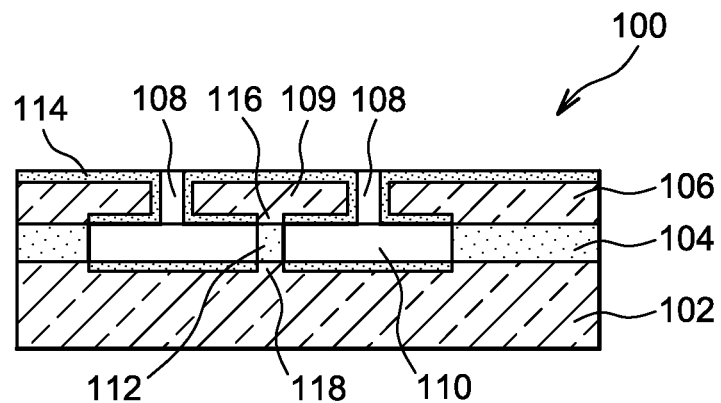

A step of thermal oxidation of the silicon of the MEMS 100 is then carried out. In FIG. 4, it can be seen that all the walls of silicon of the MEMS 100 are oxidised, forming an oxide layer 114. This oxidation may for example be carried out over a depth of silicon for example between around 200 Å and 2000 Å. This oxidation may for example be obtained by a wet process heat treatment at 800° C., for example for several hours. In FIG. 4, the front face of the useful layer 106, the walls in the openings 108 as well as the walls of silicon in the cavity 110 are oxidised. In an alternative, the oxide layer 114 may also be obtained by a growth of oxide, for example over a thickness between around 600 Å and 6000 Å.

This oxidation makes it possible to pre-form anti-bonding stops in the useful layer 106 and/or in the substrate 102, at the level of the zones in contact with portions of the sacrificial layer 104 present in the cavity 110. In the example described here, the substrate 102 and the useful layer 106 are based on silicon. Given that the portion 112 of the sacrificial layer 104 is in contact both with the substrate 102 and with the useful layer 106, the oxidation carried out pre-forms stops both in the substrate 102 and in the useful layer 106 (stops 116 and 118 in FIG. 4). The portion(s) of the sacrificial layer 104 present in the cavity 110 therefore form a mask, enabling the formation of anti-bonding stops at the level of the portions of the substrate 102 and/or the useful layer 106 in contact with the portion(s) of the sacrificial layer 104.

It is also possible that the substrate 102 and the useful layer 106 are not based on the same material. For instance, it is possible that the oxidation is carried out uniquely in either the substrate 102 or the useful layer 106, the other not being affected by this oxidation step. In this way, stops may be formed uniquely in the substrate 102 or in the useful layer 106. Stops may also be formed successively in the substrate 102, then in the useful layer 106, or inversely. Finally, it is also possible that the portion(s) of the sacrificial layer 104 conserved in the cavity 110 is only in contact with the useful layer 106 or the substrate 102. In this case, stops are formed uniquely in the layer in contact with the portions of the sacrificial layer 104, in other words either the substrate 102, or the useful layer 106.

Figure 5:
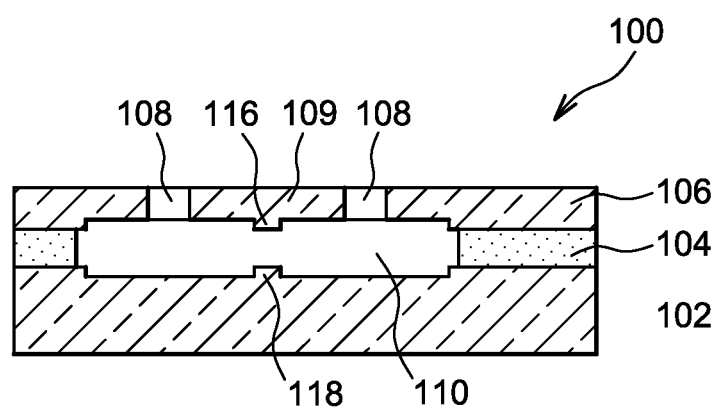

As represented in FIG. 5, an elimination of the oxide previously formed as well as the portions 112 of the sacrificial layer 104 conserved in the cavity 110 is then carried out. This elimination is for example carried out by the implementation of an etching. The portion 109 of the useful layer 106 which is here the mobile element of the MEMS 100, is therefore freed, or dissociated, from the substrate 102, except if necessary at particular spots to conserve for example mechanical anchorages of the pre-freed structure.

The anti-bonding stops 116 and 118 make it possible to maintain at distance the portion 109 of the useful layer 106 of the substrate 102, and thereby avoid an inopportune bonding between this portion 109 and the substrate 102 during a displacement of the portion 109 in relation to the substrate 102.

Electronic means, not represented, may then be formed on the device 100, for example when said device carries out a measurement of the displacement of the portion 109 during its operation. A cover, not represented, may also be formed on the useful layer 106, covering and protecting the device 100.

A second embodiment of the method for producing the device 100 is described below.

The steps described previously in relation to FIGS. 1 to 3 are firstly carried out.

Figure 6:
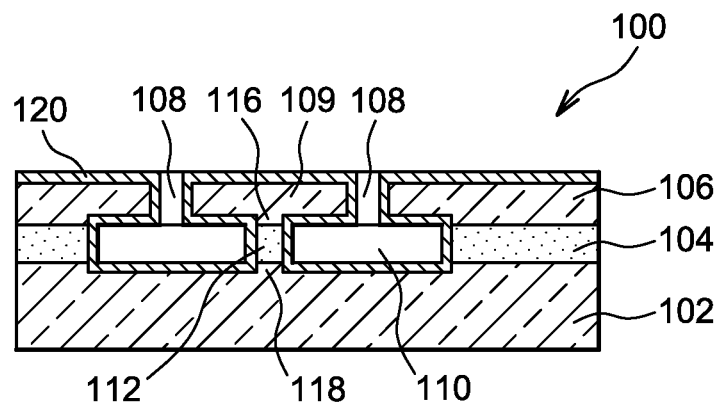
FIGS. 6 and 7 represent a method for producing a device with anti-bonding stops according to a second embodiment.

As represented in FIG. 6, a metal deposition 120 on all of the walls of the MEMS 100 is then carried out. The metal deposition 120 is sufficiently conforming to enable the covering of the walls of the cavity 110 at least at the level of the useful layer 106 and the substrate 102. Advantageously, this metal layer 120 may be deposited by ALD (atomic layer deposition). The layer 120 may particularly be based on nickel and/or titanium, and have a thickness between around 200 Å and 2000 Å.

Figure 7:
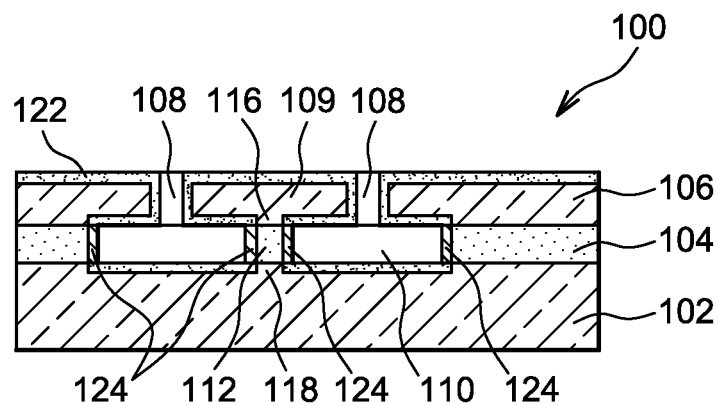
Figure 8:
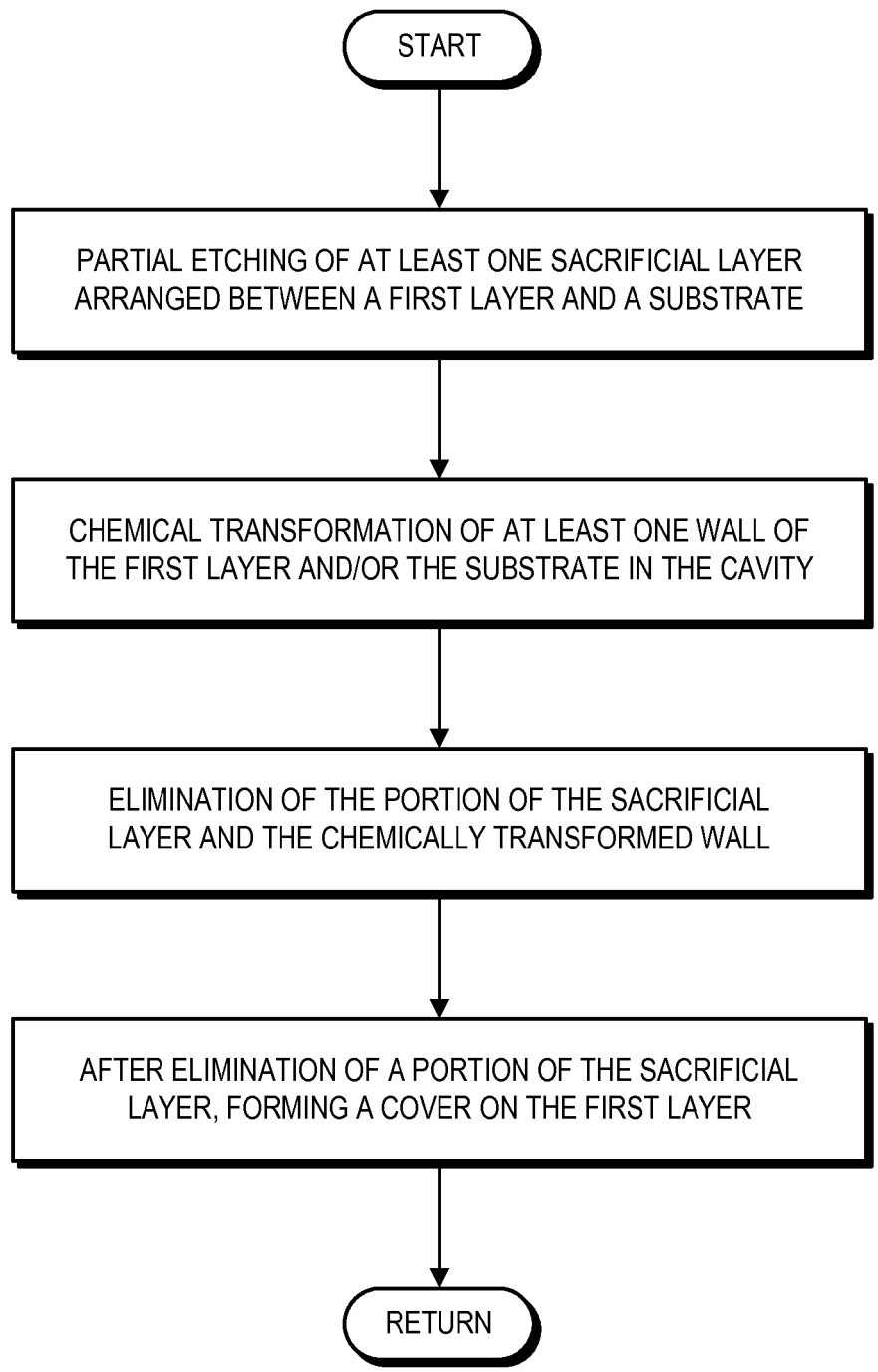
FIG. 8 is a flow diagram illustrating steps of a method for producing a device with anti-bonding stops according to an embodiment.

After this step of metal deposition, a heat treatment is implemented which makes it possible to transform the metal layer 120 into a silicide layer 122, at least at the level of the useful layer 106 and the substrate 102 (FIG. 7). Only metal portions 124 in contact with the sacrificial layer 104, which have not been transformed into silicide, may be present in the cavity 110, as is the case in FIG. 7.

One or several steps of selective etching make it possible to eliminate these metal portions 124, the layer of silicide 122 as well as the portion 112 of the sacrificial layer 104 present in the cavity 110. If the metal layer 120 previously deposited is based on titanium, this etching is for example carried out from a solution of HF which makes it possible to carry out in a single step the etching of the metal (portions 124), the silicide (layer 122) and the sacrificial oxide (portion 112). The device 100 thereby obtained is for example similar to the device 100 represented in FIG. 5.

Whatever the embodiment, the chemical transformation carried out (oxidation or siliconizing) may also affect the lateral walls and the rear face of the device when they are not protected, without compromising the formation of the anti-bonding stop(s).

The invention claimed is:

1. A method for producing a micromechanical and/or nanomechanical device comprising:
   partial etching of at least one sacrificial layer arranged between a first layer and a substrate, forming at least one cavity in which is arranged at least one portion of the sacrificial layer in contact with the first layer and/or the substrate,
   chemically transforming:
   (i) at least a portion of a front face of the first layer,
   (ii) at least a portion of a wall defining an opening formed in the first layer, and
   (iii) at least one wall of the first layer, the substrate, or of both the first layer and the substrate defining an interior of the at least one cavity to form a protective layer covering the portion of the front face and the at least one wall facing the interior of the at least one cavity between the first layer and the substrate, delimiting at least one stop in the first layer and/or the substrate at a level of the portion of the sacrificial layer, wherein formation of the protective layer by said chemically transforming comprises thermal oxidation of the portion of the front face and the at least one wall, or deposition of a metal layer on the portion of the front face and the wall and a siliciding of the metal layer, and
   subsequent to the chemically transforming the portion of the front face and the at least one wall, eliminating said portion of the sacrificial layer and removing the protective layer covering the portion of the front face and the at least one wall to expose a smooth surface of the front face and the at least one wall and free the stop.

2. The method according to claim 1, wherein said chemically transforming comprises said deposition of the metal layer, and said metal layer is based on titanium, nickel, or a combination of titanium and nickel.

3. The method according to claim 1, wherein said chemically transforming comprises said deposition of the metal layer, said metal layer is based on titanium, the at least one wall is based on silicon, and the siliciding is carried out by at least one heat treatment at a temperature equal to around 700° C.

4. The method according to claim 1, wherein the partial etching is carried out through at least one opening formed through the first layer.

5. The method according to claim 1, wherein the first layer is based on at least one semiconductor, the sacrificial layer is based on at least one semi-conductor oxide, or the substrate is based on at least one semi-conductor.

6. The method according to claim 1, wherein the etching comprises implementation of a wet or vapour phase etching.

7. The method according to claim 1, wherein said chemically transforming the at least one wall is carried out over a thickness between around 200 Å and 2000 Å.

8. The method according to claim 1, wherein a height of the stop corresponds to a thickness of said protective layer covering said wall removed by said eliminating.

9. The method according to claim 1, further comprising, after eliminating said portion of the sacrificial layer, forming a cover on the smooth surface of the at least one wall of the first layer.

10. The method according to claim 1, wherein said eliminating the portion of the sacrificial layer and the protective layer comprises:
   removing a portion, but less than all of the sacrificial layer between the first layer and the substrate; and
   eliminating one portion of the sacrificial layer in contact with the first layer, the substrate, or both the first layer and the substrate, to free a portion of the first layer and allow movement of the portion of the first layer relative to the substrate.

11. The method according to claim 1, wherein said removing the protective layer comprises removing the protective layer without roughening said at least one wall to an extent that interferes with subsequent processing of the smooth surface.

12. A method for producing a micromechanical and/or nano-mechanical device comprising:
   partial etching of at least one sacrificial layer arranged between a first layer and a substrate, forming at least one cavity in which is arranged at least one portion of the sacrificial layer in contact with the first layer, and/or the substrate,
   chemically transforming:
      (i) at least a portion of a front face of the first layer,
      (ii) at least a portion of a wall defining an opening formed in the first layer, and
      (iii) at least one wall of the first layer, the substrate, or of both the first layer and the substrate defining an interior of the at least one cavity to form a protective layer covering the portion of the front face and the at least one wall facing the interior of the at least one cavity between the first layer and the substrate, wherein said protective layer shields the portion of the front face and the at least one wall and protects against roughening of the portion of the front face and the at least one wall during a subsequent etching step performed to remove the protective layer, delimiting at least one stop in the first layer and/or the substrate at a level of the portion of the sacrificial layer, and
   subsequent to the chemically transforming the portion of the front face and the at least one wall, performing the subsequent etching step to eliminate said portion of the sacrificial layer and remove the protective layer covering the portion of the front face and the at least one wall to expose a smooth surface of the portion of the front face and the at least one wall shielded by the protective layer and free the stop.

* * * * *